(12) United States Patent
Levy et al.

(10) Patent No.: US 9,787,303 B2
(45) Date of Patent: Oct. 10, 2017

(54) DRIVER CIRCUIT AND SWITCH DRIVING METHOD

(71) Applicant: General Electric Company, Schenectady, NY (US)

(72) Inventors: Yehuda Daniel Levy, Lod (IL); Ramanujam Ramabhadran, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/958,411

(22) Filed: Dec. 3, 2015

(65) Prior Publication Data

US 2017/0163257 A1 Jun. 8, 2017

(51) Int. Cl.
*H03K 19/00* (2006.01)
*H03K 17/687* (2006.01)
*H05B 33/08* (2006.01)
*H03K 17/567* (2006.01)

(52) U.S. Cl.
CPC ......... *H03K 17/687* (2013.01); *H03K 17/567* (2013.01); *H05B 33/0815* (2013.01); *H05B 33/0845* (2013.01)

(58) Field of Classification Search
USPC ... 315/186, 193, 209 R, 224, 225, 226, 291, 315/362
See application file for complete search history.

(56) References Cited

U.S. PATENT DOCUMENTS

| 4,422,050 A * | 12/1983 | Suzuki ................. H03F 1/3217 330/263 |
| 4,575,642 A | 3/1986 | Hochreutiner et al. |
| 6,262,564 B1 | 7/2001 | Kanamori |
| 2007/0025123 A1* | 2/2007 | Kim ....................... H02M 1/08 363/16 |
| 2011/0025397 A1* | 2/2011 | Wang ............. H03K 19/018521 327/333 |
| 2015/0092307 A1* | 4/2015 | Petruzzi ................ H02H 9/043 361/56 |

FOREIGN PATENT DOCUMENTS

JP 2014093585 A 5/2014

OTHER PUBLICATIONS

International Search Report and Written Opinion issued in connection with corresponding PCT Application No. PCT/US2016/062423 dated Feb. 9, 2017.

* cited by examiner

*Primary Examiner* — Douglas W Owens
*Assistant Examiner* — Jianzi Chen
(74) *Attorney, Agent, or Firm* — Peter T. DiMauro; GE Global Patent Operation

(57) ABSTRACT

There are provided a driver circuit, a method of driving a power switch, and a ballast circuit. For example, there is provided a driver circuit configured to receive a control signal and operate a power switch. The driver circuit includes a first switch, a second switch, and a capacitor coupled to control terminals of the first and second switches. The driver circuit further includes a first diode coupled to a first bias terminal of the driver circuit and to the capacitor. Furthermore, the driver circuit includes a second diode coupled to a second bias terminal of the driver circuit and to a terminal of the power switch.

16 Claims, 4 Drawing Sheets

100

200

300

400

DRIVER CIRCUIT AND SWITCH DRIVING METHOD

TECHNICAL FIELD

The present disclosure generally relates to driver circuits. More particularly, the present disclosure relates to gate driver circuits and driving methods for use with switches.

BACKGROUND

The number of applications that make use of power metal-oxide-semiconductor field effect transistors (MOSFETs) or insulated gated bipolar transistors (IGBTs) has increased in recent years as a result of the technological maturity reached in the manufacture of these devices, but more importantly, as a result of their falling retail prices. For example, discrete silicon carbide power MOSFETs are now affordable, and they can now be used in power supplies of street luminaires, as they provide high voltage switching with negligible dynamic power dissipation due to the low leakage currents afforded by the wide bandgap of silicon carbide Despite these advantages, several issues remain in integrating power MOSFETs in a wide variety of circuits. For example, in power supply applications, current driver circuits for operating power MOSFETS may output voltage levels that are lower in magnitude than those required to drive SiC power MOSFETs or IGBTs. Furthermore, as a result of threshold voltage drifts encountered in SiC devices, it may be necessary to turn off a SiC power MOSFETs using a negative voltage, a capability that is not currently offered by existing driver circuits.

SUMMARY

The embodiments featured herein help solve or mitigate the above-noted issues as well as other issues known in the art. Particularly, in luminaires that make use of light-emitting diodes, LED drivers according to embodiments of the invention can make use of SiC MOSFETs driven with a voltage from 15-20V. Moreover, a negative bias can also be used at around −5V to turn-off the SiC MOSFETs, without running the risk of unwanted turn-ons or weak inversion, as a result of threshold voltage drift. Further, embodiments of the invention provide the same aforementioned capabilities to ballast and driver circuits that make use of IGBTs. In some embodiments, a microcontroller producing a 3.3. V signal, can be level shifted to 5V and used to drive a GaN power, concurrently with negative voltage (−2V) to turn off the GaN MOSFET. Furthermore, while the embodiments are described in the context of IGBTs and SiC MOSFETs for exemplary purposes, they can be used with any power transistor (MOSFET or BJT), such as for example, Gallium Nitride (GaN) MOSFETs. In the latter case, embodiments of the invention are especially useful in allowing operation in either an enhancement or a depletion mode, where providing a negative bias to the power MOSFET control terminal is required. For example, in such embodiments, a microcontroller can produce a 3.3. V signal, which is subsequently level shifted to 5V and used to drive a GaN power MOSFET; a negative voltage (e.g. −2V) can then be used to turn off the GaN power MOSFET.

In one exemplary embodiment, there is provided a driver circuit configured to receive a control signal and operate a power switch. The driver circuit includes a first switch, a second switch, and a capacitor coupled to control terminals of the first and second switches. The driver circuit further includes a first diode coupled to a first bias terminal of the driver circuit and to the capacitor. Furthermore, the driver circuit includes a second diode coupled to a second bias terminal of the driver circuit and to a terminal of the power switch.

In another exemplary embodiment, there is provided a method of operating a power switch. The method includes providing a level-shifted positive bias to a driver circuit of the power switch. Further, the method includes providing a negative bias to the driver circuit of the power switch. Furthermore, the method includes operating the power switch between a first rail substantially equal to the level-shifted positive bias and a second rail substantially equal to the negative bias.

In yet another exemplary embodiment, there is provided a ballast circuit that includes a power switch and a driver circuit configured to operate the power switch. The driver circuit may include a first switch, a second switch, and a capacitor coupled to control terminals of the first and second switches. The driver circuit may further include a first diode coupled to a first bias terminal of the driver circuit and to the capacitor. Furthermore, the driver circuit may include a second diode coupled to a second bias terminal of the driver circuit and to a terminal of the power switch.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
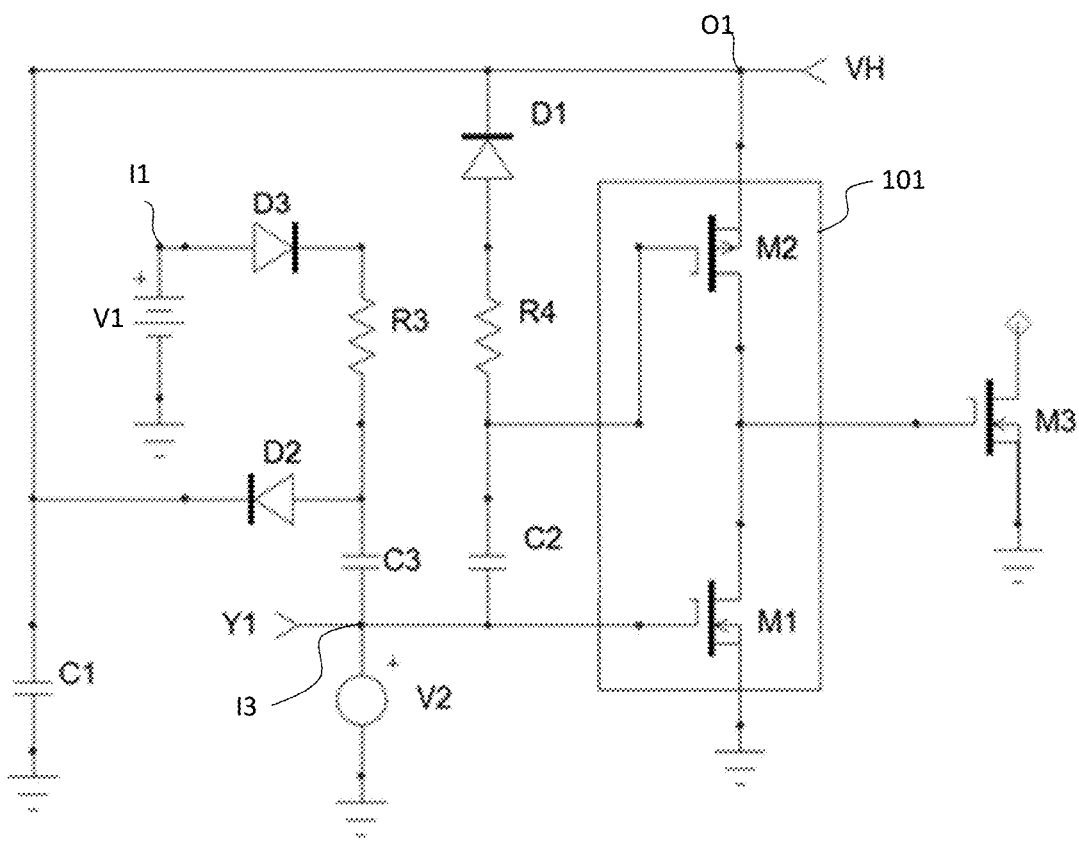
FIG. 1 is an illustration of a driver circuit, according to an embodiment.

FIG. 1 is an illustration of a driver circuit 100, according to an embodiment. Driver circuit 100 includes diodes D1, D2, and D3, capacitors C1, C2, and C3, and resistors R3 and R4. Driver circuit 100 further includes switches M1 and M2, which form a complementary pair 101. M2 is a p-channel MOSFET whereas M1 is a n-channel MOSFET. Furthermore, driver circuit 100 includes a low voltage bias input terminal I1 at which a low voltage bias V1 can be applied. Furthermore, driver circuit 100 includes a high voltage output terminal O1 at which a voltage VH is outputted. As explained below, VH is a level-shifted version of V1. In some embodiment, VH may be substantially twice the value of V1. Driver circuit 100 further includes an input terminal I3 where a logic drive voltage V2 can be applied from a control circuit (not shown) or supplied through port Y1. Logic drive voltage V2 can be a digital signal that controls complementary pair 101.

In other embodiments, VH may be a voltage that is "n" times the value of V1, where "n" is a positive real number greater than 1. Furthermore, in some embodiments, driver circuit 100 may include a programmable controller that is configured to output a predetermined value of VH based on pre-programmed values of the parameter "n."

Driver circuit 100 can be interfaced at the output node of complementary pair 101 to a power MOSFET M3 (as depicted in FIG. 1). Without loss of generality, driver circuit 100 can also be interfaced with an IGBT instead of a power MOSFET. During operation, the leakage current of diode D1 allows capacitor C2 to charge to a differential voltage equal to the difference between VH and the logic drive voltage V2, which controls complementary pair 101, and consequently, the switching behavior of power MOSFET M3.

Diodes D2 and D3 and capacitors C1 and C3 essentially add to voltage V1, thus shifting it to a higher level. In the embodiment shown in FIG. 1, diodes D2 and D3 and capacitors C1 and C3 cooperatively function to double voltage V1, yielding VH at output terminal O1. For example, if V1 is +12V, VH will be approximately +24V. While driver circuit 100 is implemented using a voltage double network (D2, D3, C1, and C3), any charge pumping architecture or level shifting architecture can be used to obtain a predetermined output voltage VH. For example, additional diodes, or larger capacitances can be used to control voltage VH and obtain a desired multiplied version of low bias voltage V1.

The high voltage VH allows the gate of M3 to be driven with a higher positive voltage (i.e. higher than V1). As such, this is done without the need of a separate auxiliary voltage source. Further, while driver circuit 100 can effectively interface with a power MOSFET requiring only high positive voltages, it must be modified to allow interfacing with SiC power MOSFETs or with IGBTs. Specifically, even though driver 100 circuit provides a high voltage for the ON state of the M3, in its OFF-state it still drives the gate of M3 to zero. As explained above, with any variation in threshold, transistor M3 may leave the cut-off region and enter weak inversion, thereby causing increased leakage currents and undesired current delivery to a load coupled to M3.

As such, a negative voltage source capable of providing a negative turn-off bias to transistor M3 must be included in driver circuit 100. This is shown conceptually in FIG. 2, which depicts a driver circuit 200 that is a partial and modified version of driver circuit 100.

In driver circuit 200, VH is generated using a level shifting network like the one described with respect to driver circuit 100. Logic voltage V2 drives the complementary pair formed by M2 and M1, and like in driver circuit 100, the leakage current through diode D1 charges capacitor C2, which effectively sets the drive voltage of the complementary pair as a differential voltage given by the difference of VH and V2. Driver circuit 200, unlike driver circuit 100, includes an additional voltage source V3 tied to the source of M1. As such, when the complementary pair given by M1 and M2 is switching, it does so between VH and V3. V3 can be set below zero to ensure that the gate of power transistor of M3 is held at a negative potential when in the OFF state.

Figure 3:
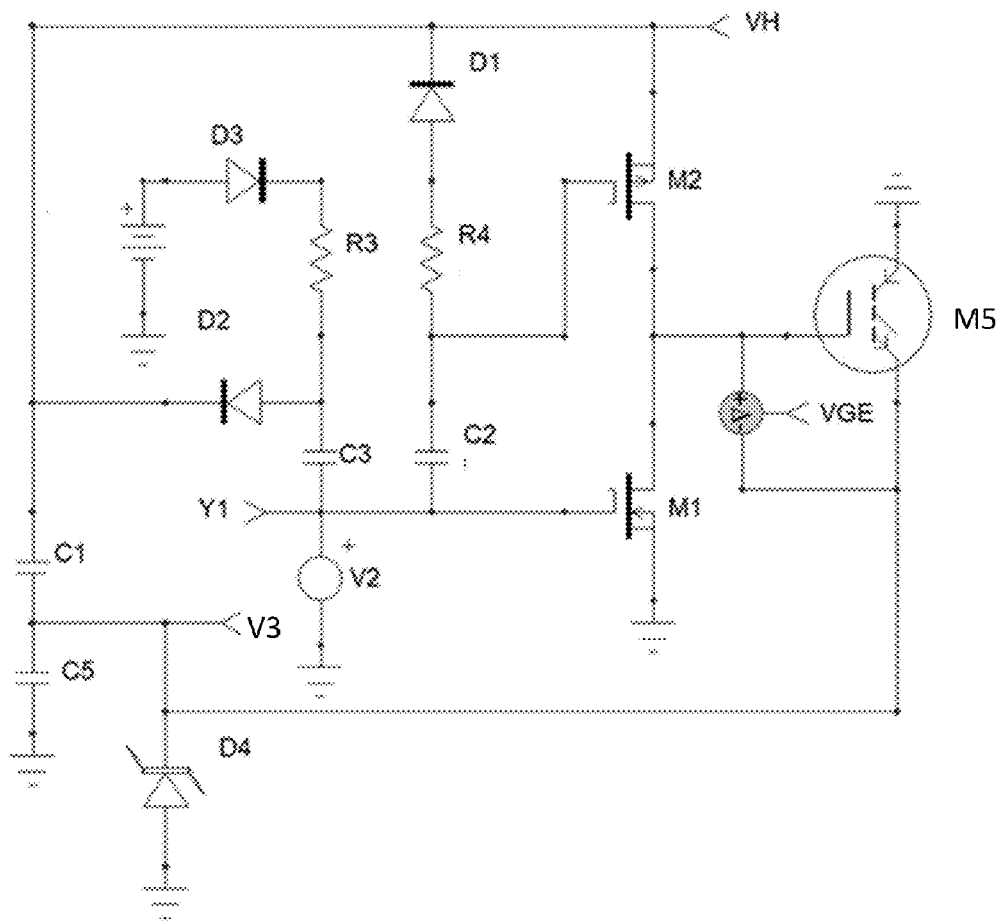
FIG. 3 is an illustration of a driver circuit, according to yet another embodiment.

FIG. 3 is an implementation of a driver circuit 300, according to an embodiment. Unlike driver circuit 200, driver circuit 300 accomplishes positive bias level shifting and negative bias generation without increasing the voltage across terminals of the complementary pair formed by M1 and M2 beyond a voltage difference equal to VH. In other words, while the embodiment of driver circuit 200 made use of an auxiliary voltage source at the source of M1, which sets the voltage across the complementary pair at VH plus the absolute value of V3, driver circuit 300 provides the negative bias needed without using an auxiliary voltage source on the source of M1. This is done to avoid subjecting M1 and M2 to large voltages, as these switches are typically low-voltage rated devices (i.e. CMOS devices). As such, in driver circuit 300, M2 and M1 are switched between VH and ground, while the negative voltage V3 is provided across a capacitor C5 and a Zener diode D4. Driver circuit 300 interfaces with an IGBT M5, whose gate and emitters are tied to the output node of the complementary pair formed by M2 and M1, which forces the gate of M5 to switch on at VH, and to C5, which forces the gate of M5 to switch off at V3, wherein V3 is a negative voltage.

Figure 2:
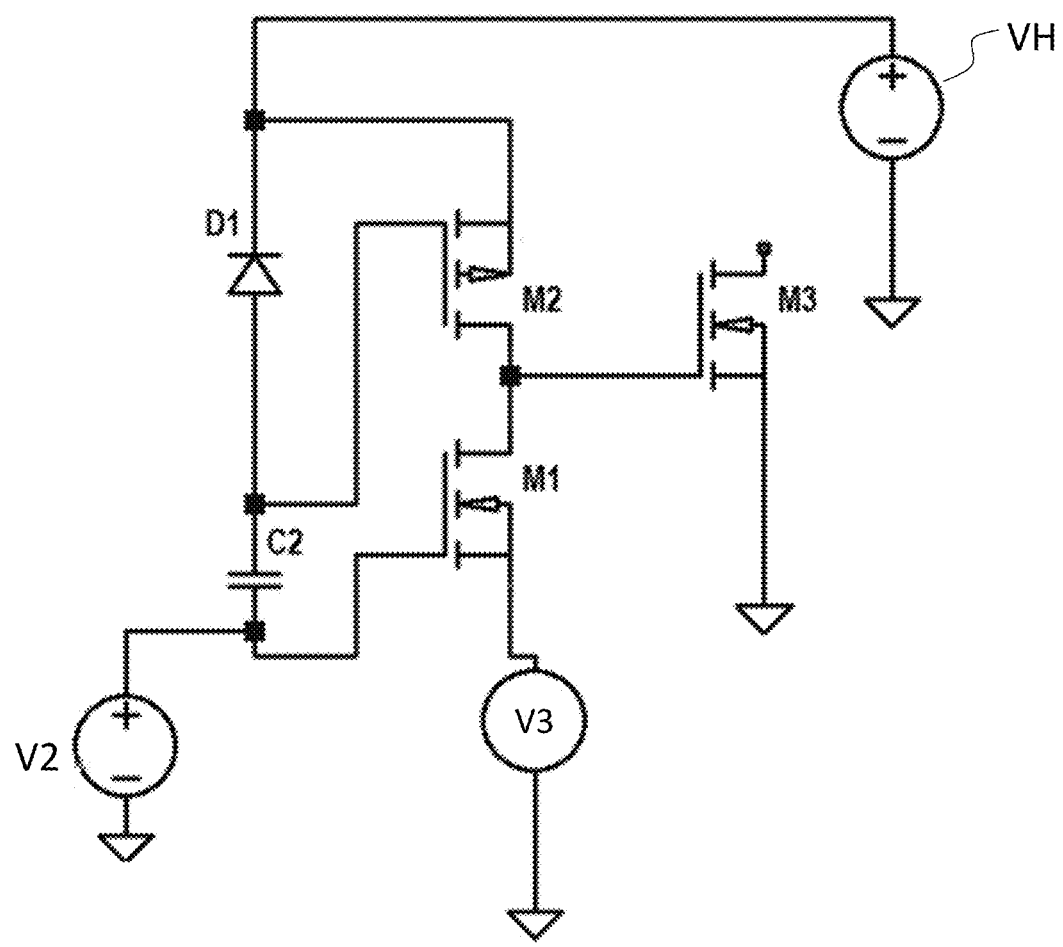
FIG. 2 is an illustration of a driver circuit, according to another embodiment.

It is noted that in the case of FIG. 1, FIG. 2, and FIG. 3, each of the driver circuits 100, 200, 300, when taken together with the power transistor they drive, form a ballast circuit, which can be used to drive LED banks in a luminaire. In other applications, the disclosed ballast circuits can also serve as an input stage in a power converter.

Figure 4:
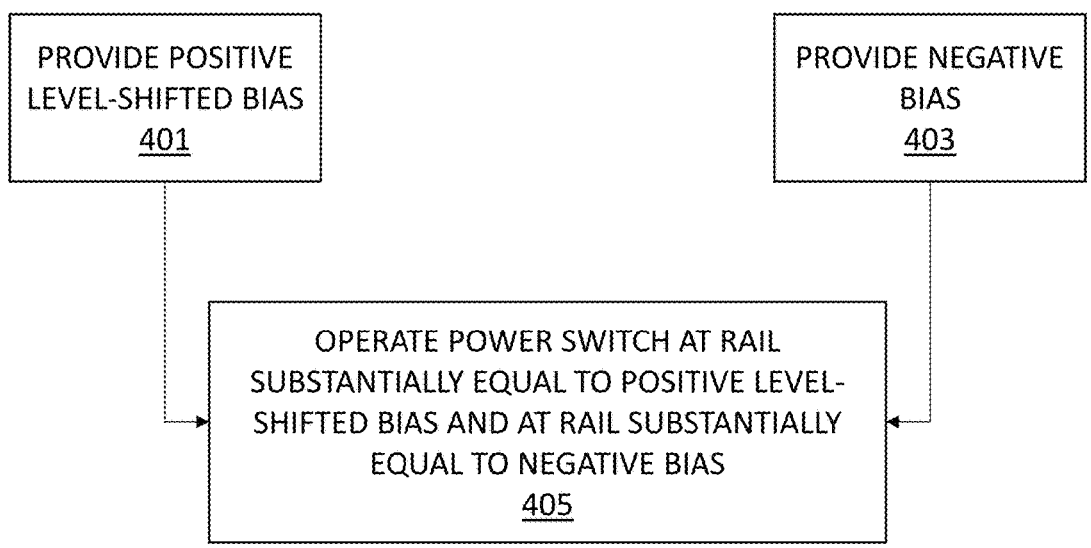
FIG. 4 is an illustration of a method, according to an embodiment.

Having set forth the structure of the various embodiments, a method consistent with the operation of the embodiments is now provided. FIG. 4 shows a method 400 of operating a power switch. The power switch can be a power transistor such as a SiC MOSFET, a GaN MOSFET, or an IGBT, or any other power transistor or the like. Method 400 can include providing a level-shifted positive bias to a driver circuit of the power switch (401). Furthermore, method 400 can include providing a negative bias to the driver circuit of the power switch. Method 400 can further include providing a control signal (403) which governs the operation of the power switch (such as the differential voltage at the input stage of the complementary switch pair formed by switches M1 and M2 in FIGS. 1-3). Method 400 can further include operating the power switch between a first rail substantially equal to the level-shifted positive bias and a second rail given substantially equal to the negative bias (405).

As described in references to FIGS. 2-3, the level-shifted positive bias can be VH and the negative bias V3. Method 400 can include doubling a positive bias (such as V1 in FIG. 1) to obtain the level-shifted bias VH. Furthermore, in method 400, operating the power switch can include setting the voltage at a control terminal of the power switch below zero in its OFF state during a particular switching cycle.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A driver circuit configured to receive a control signal and operate a power switch, the driver circuit comprising:
   a first switch;
   a second switch;
   a capacitor coupled to control terminals of the first and second switches;
   a first diode coupled to a first bias terminal of the driver circuit and to the capacitor;
   a second diode coupled to a second bias terminal of the driver circuit and to a terminal of the power switch;
   wherein the capacitor is configured to control a switching behavior of the power switch according to a differential voltage equal to a difference between a voltage of the first bias terminal and a logic drive voltage of a logic drive voltage port of the driver circuit.

2. The driver circuit of claim 1, wherein the first and second switches are complementary switches.

3. The driver circuit of claim 1, wherein the first and second switches are each metal-oxide-semiconductor field effect transistors (MOSFETs).

4. The driver circuit of claim 3, wherein the first switch is a p-channel MOSFET and the second switch is an n-channel MOSFET.

5. The driver circuit of claim 1, wherein the power switch is a one of (i) a silicon carbide (SiC) metal-oxide-semiconductor field effect transistor (MOSFET) and (ii) an insulated-gate bipolar transistor (IGBT).

6. The driver circuit of claim 1, wherein the power switch is a power metal-oxide-semiconductor field effect transistor (MOSFET).

7. The driver circuit of claim 1, wherein the second diode is a Zener diode.

8. The driver circuit of claim 1, wherein the first bias terminal is a positive bias terminal and the second bias terminal is a negative bias terminal.

9. The driver circuit of claim 1, wherein the first bias terminal is configured to provide a level-shifted bias from a positive bias and the second bias terminal is configured to provide a level-shifted bias from a negative bias.

10. The driver circuit of claim 1, further comprising a control port configured to receive a control signal for driving the first and second switches.

11. A light-emitting diode (LED) ballast circuit, comprising:
   a power switch;
   a driver circuit configured to operate the power switch, the driver circuit including:
      a first switch;
      a second switch;
      a capacitor coupled to control terminals of the first and second switches;
      a first diode coupled to a first bias terminal of the driver circuit and to the capacitor;
      a second diode coupled to a second bias terminal of the driver circuit and to a terminal of the power switch;
   wherein the capacitor is configured to control a switching behavior of the power switch according to a differential voltage equal to a difference between a voltage of the first bias terminal and a logic drive voltage of a logic drive voltage port of the driver circuit.

12. The ballast circuit of claim 11, wherein the first and second switches are complementary switches.

13. The ballast circuit of claim 11, wherein the first and second switches are each metal-oxide-semiconductor field effect transistors (MOSFETs).

14. The ballast circuit of claim 13, wherein the first switch is a p-channel MOSFET and the second switch is an n-channel MOSFET.

15. The ballast circuit of claim 11, wherein the power switch is a one of (i) a silicon carbide (SiC) metal-oxide-semiconductor field effect transistor (MOSFET) and (ii) an insulated-gate bipolar transistor (IGBT).

16. The ballast circuit of claim 11, wherein the power switch is a power metal-oxide-semiconductor field effect transistor (MOSFET).

* * * * *